(12) United States Patent
Huang et al.

(10) Patent No.: US 8,972,912 B1
(45) Date of Patent: Mar. 3, 2015

(54) STRUCTURE FOR CHIP EXTENSION

(71) Applicant: Taiwan Semiconductor Manufacturing Co., Ltd., Hsin-Chu (TW)

(72) Inventors: Chin-Min Huang, Taichung (TW); Chia-Cheng Chang, Baoshan Township (TW); Cherng-Shyan Tsay, Toufen Township (TW); Chien-Wen Lai, Hsinchu (TW); Kong-Beng Thei, Pao-Shan Village (TW); Hua-Tai Lin, Hsinchu (TW); Hung-Chang Hsieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/029,902

(22) Filed: Sep. 18, 2013

(51) Int. Cl.
*G06F 17/50* (2006.01)

(52) U.S. Cl.
CPC ........ *G06F 17/5081* (2013.01); *G06F 17/5072* (2013.01)
USPC .............. 716/55; 716/119; 716/122; 716/126

(58) Field of Classification Search
None
See application file for complete search history.

(56) References Cited

U.S. PATENT DOCUMENTS

| 5,652,163 A | * | 7/1997 | Schinella et al. | 438/599 |
| 8,704,384 B2 | * | 4/2014 | Wu et al. | 257/782 |
| 2005/0273749 A1 | * | 12/2005 | Kirk | 716/16 |
| 2010/0064273 A1 | * | 3/2010 | Credendino et al. | 716/19 |
| 2010/0248093 A1 | * | 9/2010 | Yang | 430/5 |

* cited by examiner

*Primary Examiner* — Leigh Garbowski
(74) *Attorney, Agent, or Firm* — Eschweiler & Associates, LLC

(57) ABSTRACT

One embodiment relates to a method of achieving an circuit dimension which is greater than a size of an exposure field of an illumination tool. A first area of a first reticle field and a second area of a second reticle field are defined. An extension zone is created as a region outside the first area, and includes a first layout shape formed on a first design level. A corresponding forbidden zone is created for the second reticle field as a region inside the second area where no layout shape on the first design level is permitted. A second layout shape is formed on a second design level within the forbidden zone. The first and second areas are then abutted. Upon abutment of the first and second areas, the second layout shape overlaps the first layout shape to form a connection between circuitry of the first and second reticle fields.

20 Claims, 8 Drawing Sheets

STRUCTURE FOR CHIP EXTENSION

BACKGROUND

The following disclosure relates to patterning of a plurality of reticle fields disposed on a wafer, and a method to form connections between circuitry disposed on adjacent reticle fields.

DETAILED DESCRIPTION

Figure 1:
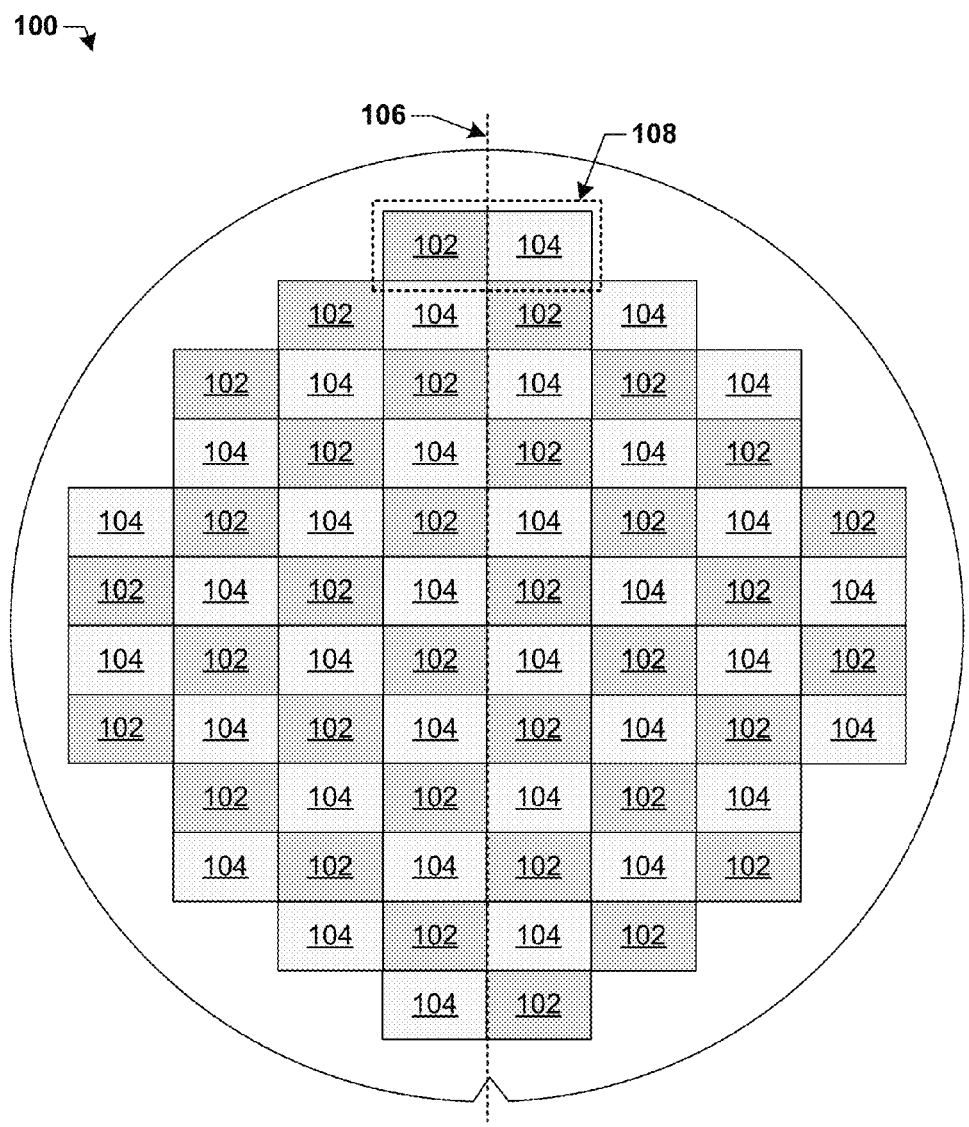
FIG. 1 illustrates a plurality of reticle fields disposed on a surface of a wafer, wherein connections are formed between circuitry of adjacent reticle fields.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

In semiconductor manufacturing, a wafer comprising a periodic array of reticle fields is patterned through a sequence of successive photolithography steps, wherein each reticle field is patterned individually by a step-and-repeat tool. The photolithography steps include alignment of a photomask with each reticle field, and exposure of light from a illumination tool through the photomask onto the reticle field. The illumination transfers a pattern from the photomask onto a layer of photoresist disposed on the wafer. After all of the reticle fields have been aligned and exposed by the step-an-repeat tool, the photoresist layer is developed, and the developed portions are dissolved. The wafer is then subjected an etch, implant, or other process which forms components of an IC within each reticle field corresponding to the pattern. Uniform illumination conditions across a reticle field (e.g. focus and dose) limit the amount of surface area of the wafer that the illumination tool can illuminate in a single exposure. This defines an exposure field of the illumination tool.

Accordingly, the present disclosure relates to a method and system to achieve an IC dimension which is greater than a size of an exposure field of the illumination tool. The method comprises defining a first area of a first reticle field and a second area of a second reticle field. An extension zone is created as a region outside the first area, and includes a first layout shape formed on a first design level. A corresponding forbidden zone is then created for the second reticle field as a region inside the second area where no layout shape formed on the first design level is permitted. A second layout shape is then formed on a second design level within the forbidden zone. The first and second areas are then abutted when forming a plurality of reticle fields for wafer patterning. Upon abutment of the first and second areas, the second layout shape overlaps the first layout shape to form a connection between circuitry of the first and second reticle fields.

FIG. 1 illustrates a plurality of reticle fields disposed on a surface of a wafer 100. For the embodiments of FIG. 1, the wafer 100 comprises a silicon (Si) wafer. Alternatively, the wafer 100 may comprise another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof.

The plurality of reticle fields include two types of reticle fields: a first reticle field type 102, comprising a first circuit component; and a second reticle field type 104, comprising a second circuit component. Some IC manufacturing techniques comprise dicing of the wafer 100 along scribe lines 106 which separate adjacent reticle fields. Scribing is achieved by mechanical means such as a dicing saw, or by a laser, into first and second die, respectively. For the embodiments of the present disclosure, a pair 108 of first and second reticle field types 102, 104 are coupled by a connection across the scribe line 106, which couples the first and second circuit components, effectively doubling a size of an IC formed from a single reticle field.

For the embodiments of FIG. 1, the pair 108 of first and second reticle field types 102, 104 are not scribed along the scribe line 106, but rather remain coupled to form a single IC after scribing. Scribe lines 106 between uncoupled first and second reticle field types 102, 104 are diced to separate the single ICs formed from the coupled first and second reticle field types 102, 104. In some embodiments, the scribe lines 106 comprises a crack stop structure configured for mechanical re-enforcement of the wafer 100 during scribing. In some embodiments, the scribe lines 106 comprise a moisture barrier configured to prevent contamination of circuitry within diced die. In some embodiments, while the scribe line 106 between coupled first and second reticle field types 102, 104 forming a single IC are un-diced, the crack stop, moisture barrier, or other shapes (e.g., alignment marks, metrology structures, etc.) can be used to identify a boundary between the first and second reticle field types 102, 104 within a die.

It is appreciated that in various embodiments the first and second circuit components of the coupled IC may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), finFET transistors, ultra-high voltage (UHV) devices, other high power MOS transistors, or other types of transistors.

Figure 2A:
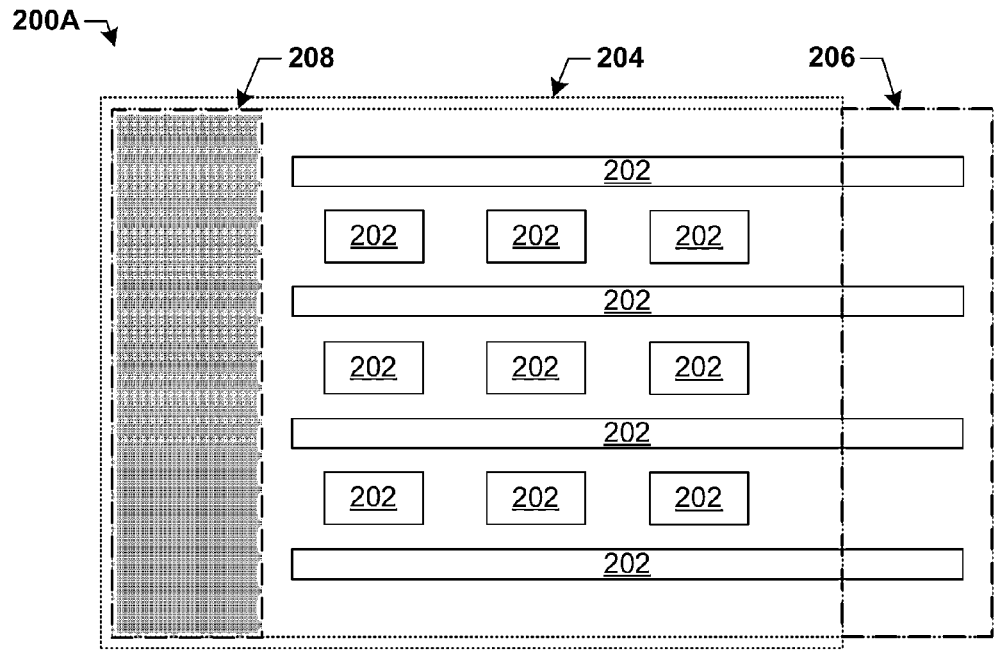
FIGS. 2A-2B illustrate some embodiments of an extension zone and a forbidden zone corresponding to an integrated circuit (IC) layout.

FIG. 2A illustrates of a layout view 200A corresponding to a reticle field, comprising a plurality of first layout shapes 202 formed on a first design level (e.g., a gate design level, a metallization design level, etc.), within a chip area 204 of the layout view 200A. In some embodiments, the layout view 200A comprises an industry-standard layout format such as GDSII or OASIS, formed in an industry-standard layout design tool such as a CADENCE VIRTUOSO or MENTOR GRAPHICS design window. The layout view 200A also comprises an extension zone 206, which resides outside the chip area 204, and includes one or more first layout shapes 202. The layout view 200A further comprises a forbidden zone 208, which resides inside the chip area 204, where no first layout shape 202 is permitted by layout guidelines.

In some embodiments, the layout guidelines comprise "design rules" which define allowed geometries and placement of the first layout shapes 202, extension zone 206, and forbidden zone 208 relative to the chip area 204. A design rule outlawing placement of first layout shapes 202 within the forbidden zone 208 is one example. A design rule outlawing a first layout shape 202 with a size below a minimum threshold is another example.

Figure 2B:
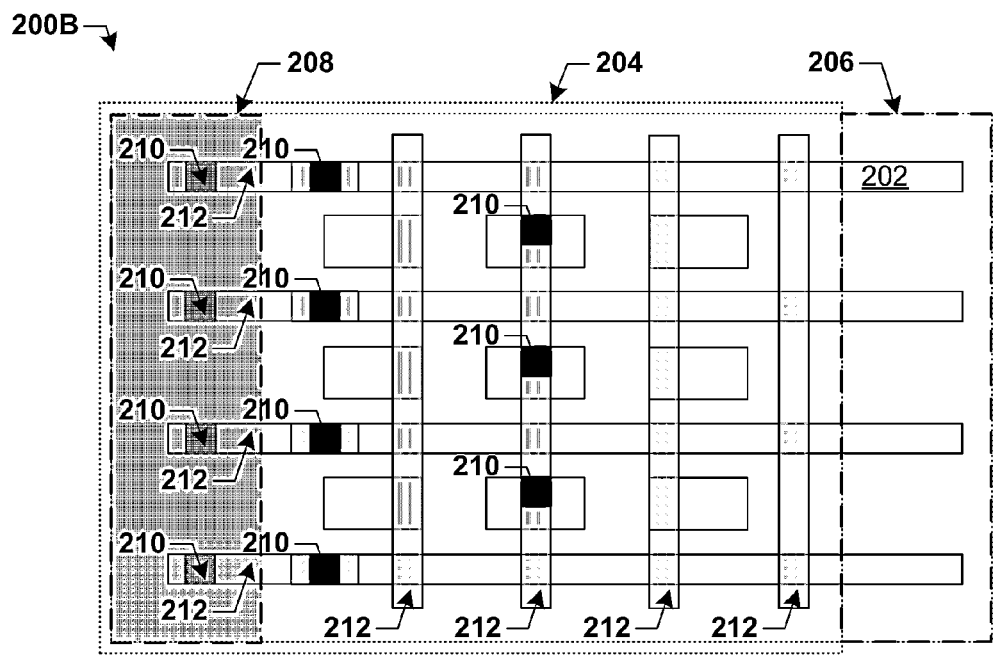

FIG. 2B illustrates of a layout view 200B, comprising layout view 200A, wherein additional layout shapes have been placed above the first layout shapes 202. Note that in FIG. 2B only a single first layout shape 202 is numbered. The other numerical labels (202) have been removed to enhance readability. However, as the pattern of first layout shapes 202 is identical between FIG. 2A and FIG. 2B, the first layout shapes 202 are discernible in FIG. 2B. The additional layout shapes comprise second layout shapes 210 (e.g., formed on a gate contact design level or on a metal via design level), and third layout shapes 212 (e.g., formed on a metallization design level). The second layout shapes 210 form connections between the first layout shapes 202 and the third layout shapes 212 in layout view 200B. The first, second, and third layout shapes 202, 210, 212 of the layout view 200B will be decomposed onto three respective quartz photomasks for patterning of these features on a semiconductor substrate (e.g., a reticle field of wafer 100).

Note that the second and third layout shapes 210, 212 of FIG. 2B extend into the forbidden zone 208. In some embodiments, the aforementioned design rules outlaw placement of first layout shapes 202 within the forbidden zone 208, while requiring exact placement of the second and third layout shapes 210, 212 relative to the first layout shapes 202, chip area 204, or forbidden zone 208. It will be demonstrated in the embodiments of FIG. 3 that the exact placement enforced by the design rules ensures both manufacturability and alignment of the second and third layout shapes 210, 212 residing in the forbidden zone 208 of a first layout view 200B, to first layout shapes residing in the extension zone 206 of a second layout view 200B, when two such layout views 200B are placed side-by-side, such that their respective chip areas 204 abut.

Figure 3A:
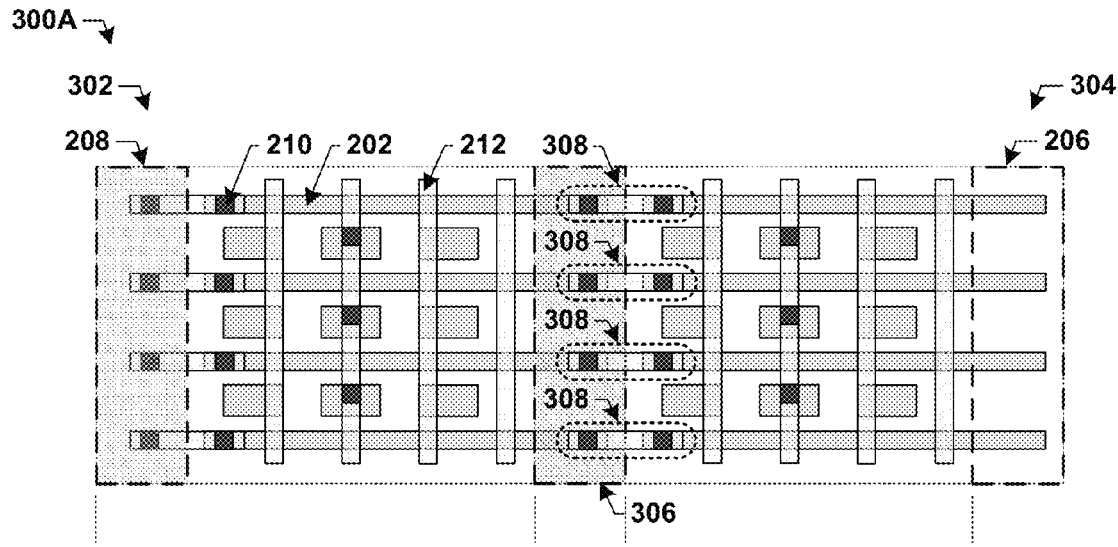
FIGS. 3A-3C illustrate some embodiments of a connection formed across a boundary between two adjacent reticle fields.

FIG. 3A illustrates the top view 300A of an abutment of a first chip area 302 and a second chip area 304, wherein the first and second chip areas 302, 304 each comprise layout view 200B. The abutment of the first and second chip areas 302, 304 forms an interconnect zone 306 within the second chip area 304 comprising an intersection of the extension zone 206 and the forbidden zone 208. Connections 308 are formed between the first and second chip areas 302, 304 through the second and third layout shapes 210, 212 of the second chip area 304, and the first layout shapes 202 of the first chip area.

It is again appreciated that the numerical labels have again been removed from all but one of the first, second, and third layout shapes 202, 210, 212 of FIG. 3A to enhance readability. However, as the pattern of the first, second, and third layout shapes 202, 210, 212 is identical between FIGS. 2A-2B and FIG. 3A, these shapes are discernible. Note further that this practice will be followed again in FIGS. 3B-3C, FIGS. 4A-4F, and FIGS. 8A-8C.

For the embodiments of FIGS. 2A-2B and FIG. 3A, extension zone 206 and the forbidden zone 208 are positioned along opposite edges of a boundary defining the a respective chip area, and comprise identical shapes. As a result, the abutment of the first and second chip areas 302, 304 results the interconnect zone 306 which also forms an identical shape to the extension zone 206 and the forbidden zone 208. In other embodiments, the extension zone 206 and the forbidden zone 208 do not form identical shapes.

Figure 3B:
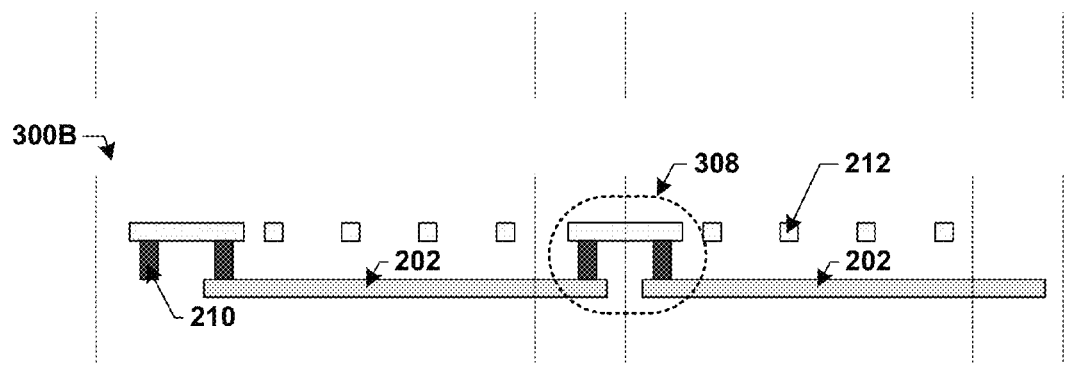
Figure 3C:
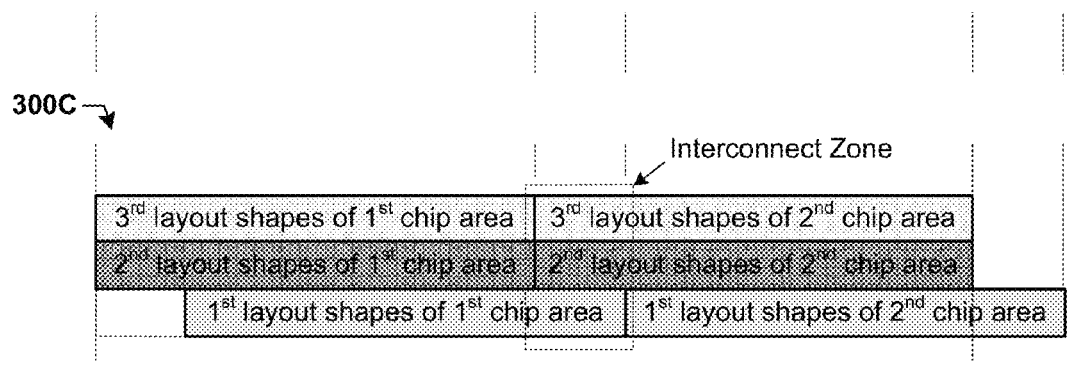

FIG. 3B illustrates a cross-sectional view 300B of the top view 300A, wherein a connection 308 between the first and second chip areas 302, 304 within the interconnect zone 306 is illustrated. FIG. 3C illustrate cross-sectional view 300C of layout shape occupancy within the first and second chip areas 302, 304, and the interconnect zone 306.

FIGS. 4A-4F illustrate some embodiments of patterning of two adjacent reticle fields with a step-and-repeat tool, in order to form connections across a boundary between the adjacent reticle fields. The patterning occurs within a semiconductor fabrication plant, or "fab," wherein a series of photomasks are aligned with a wafer to transfer respective patterns of the photomask onto a surface of the wafer. In some embodiments, the wafer comprises a 300 mm wafer or a 450 mm wafer for manufacturing within the fab, wherein two adjacent reticle fields are exposed individually to form the respective pattern. The step-and-repeat tool is used to align a photomask with metrology structures of a respective reticle field to ensure robust alignment. After patterning of the respective reticle field, the step-and-repeat tool moves to the next adjacent reticle field. After then entire surface of the wafer has been patterned, additional manufacturing steps follow, comprising photoresist development, layer etch, implantation, epitaxial layer growth, etc. to form a pattern which defines device structures and interconnects of the integrated circuit (IC), within a respective reticle field.

Figure 4A:
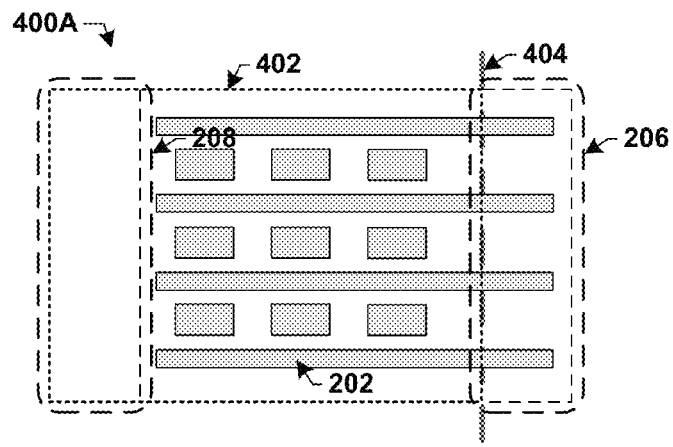
FIGS. 4A-4F illustrate some embodiments of patterning adjacent reticle fields with a step-and-repeat tool, in order to form connections across a boundary between the adjacent reticle fields.

FIG. 4A illustrates a first exposure by a first photomask coupled to the step-and-repeat tool, to form a first pattern of first layout shapes 202 within a first reticle field 402. The first reticle field 402 comprises a first extended zone 206 residing outside a reticle field boundary 404 (i.e., a scribe line). The first extended zone 206 comprises first layout shapes 202. The first reticle field 402 further comprises a first forbidden zone 208 in which no first layout shapes 202 are permitted.

Figure 4B:
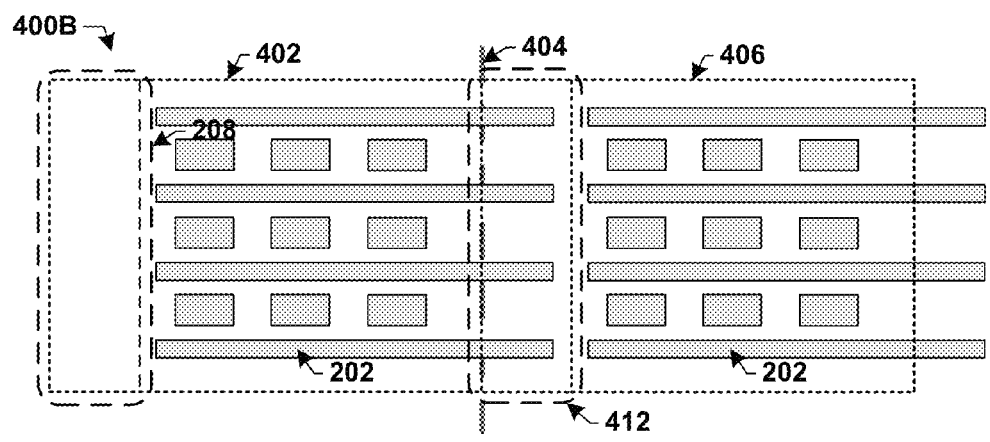

FIG. 4B illustrates a second exposure by the first photomask to form a second pattern of first layout shapes 202 within a second reticle field 406, after stepping by the step-and-repeat tool. The second reticle field 406 comprises a second extended zone which overlaps the first forbidden zone 208 to form an interconnect zone 412.

Figure 4C:
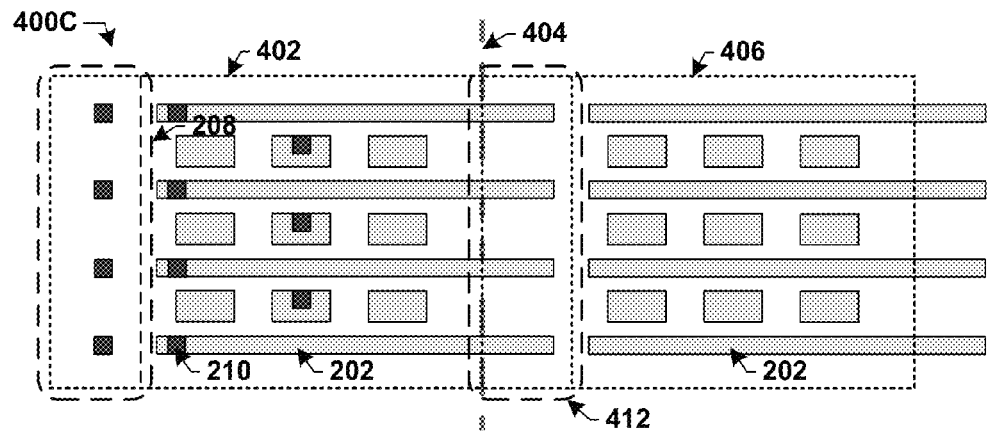

FIG. 4C illustrates a first exposure by a second photomask to form a first pattern of second layout shapes 210 within the first reticle field 402, by the step-and-repeat tool. The first pattern of second layout shapes 210 is aligned to the first layout shapes 202. The first pattern of second layout shapes 210 are also formed in the first forbidden zone 208.

Figure 4D:
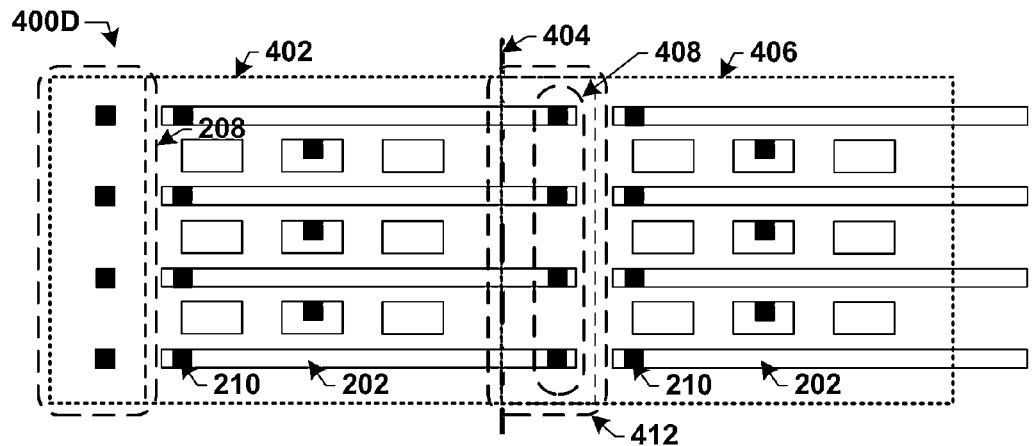

FIG. 4D illustrates a second exposure by the second photomask to form a second pattern of second layout shapes 210 within the second reticle field 406, after stepping by the step-and-repeat tool. The second pattern of second layout shapes 210 are also formed in the interconnect zone 412, and align (408) to the first layout shapes 202 within the interconnect zone 412.

Figure 4E:
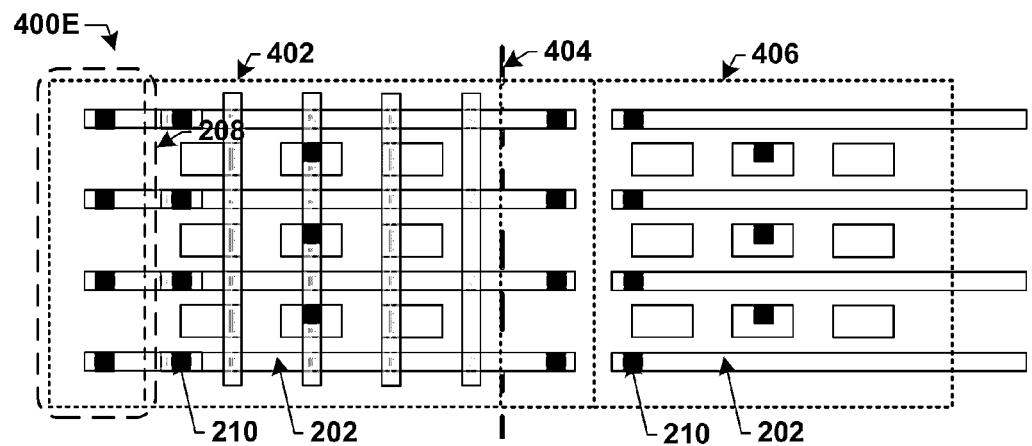

FIG. 4E illustrates a first exposure by a third photomask coupled to the step-and-repeat tool, to form a first pattern of third layout shapes 212 within the first reticle field 402. The third layout shapes 212 align to the second layout shapes 210, and are also formed in the first forbidden zone 208.

Figure 4F:
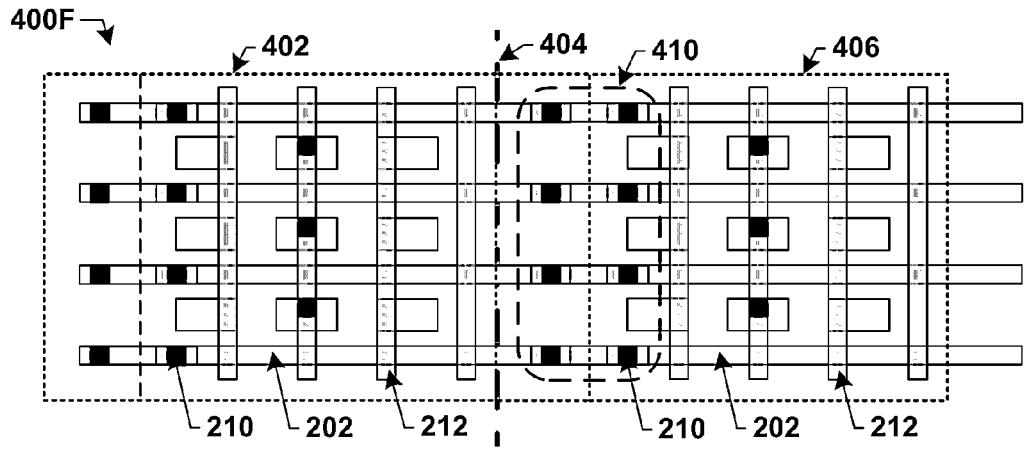

FIG. 4F illustrates a second exposure by the third photomask to form a second pattern of third layout shapes 212 within the second reticle field 406, after stepping by the step-and-repeat tool. The second pattern of third layout shapes 212 are also formed in the interconnect zone 412, and align to the second layout shapes 210 within the interconnect zone 412, to form a set of across-boundary connections 410 between to circuitry of the first and second reticle fields 402, 406, wherein the circuitry comprises the first, second, and third layout shapes 202, 210, 212.

Figure 5:
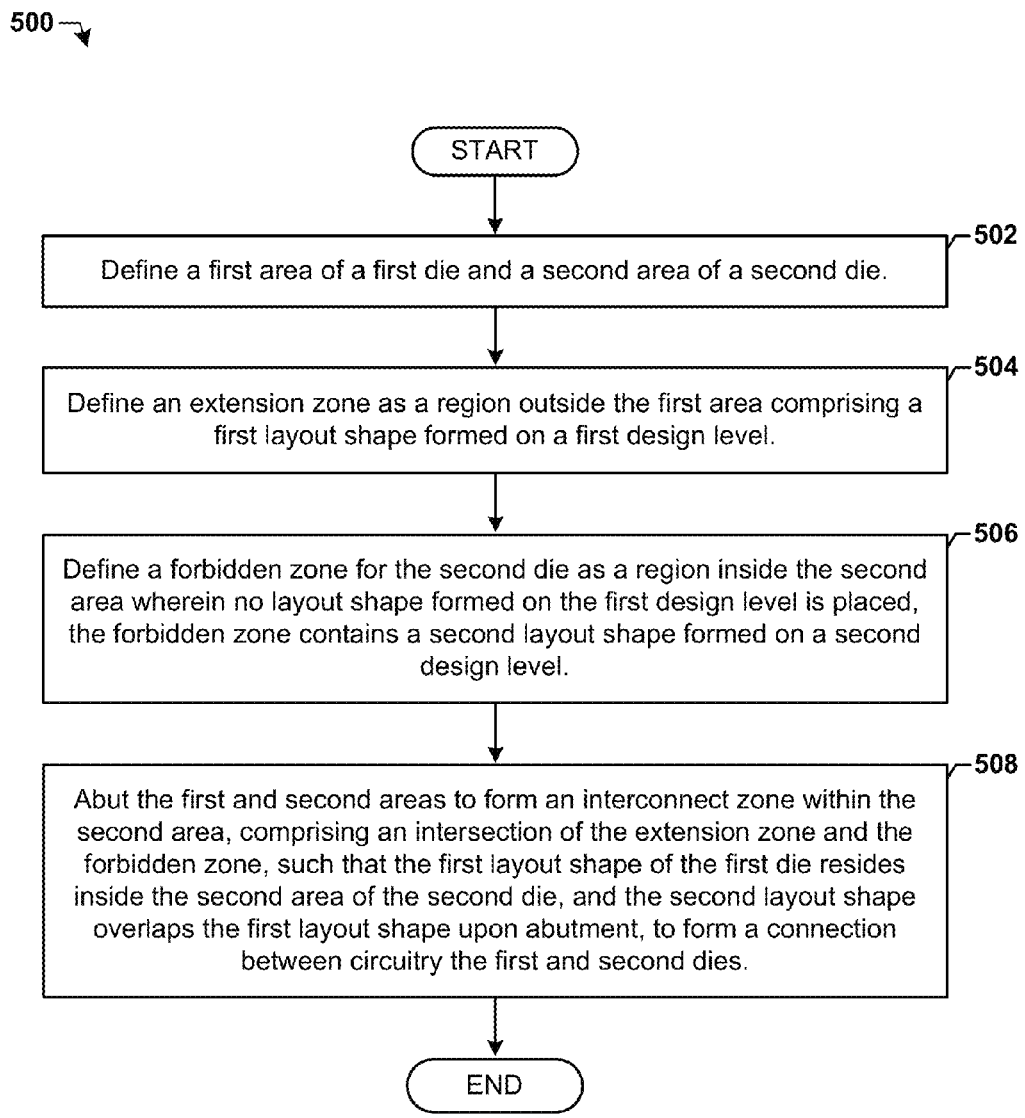
FIG. 5 illustrates some embodiments of a method of forming a connection across a reticle field boundary.

FIG. 5 illustrates some embodiments of a method 500 of forming a connection across a reticle field boundary. While the method 500 is illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502 a first area of a first reticle field and a second area of a second reticle field are defined.

At 504 an extension zone is defined as a region outside the first area comprising a first layout shape formed on a first design level. In some embodiments, the first layout shape comprises a first gate design level. In some embodiments, the first layout shape comprises a first metallization design level.

At 506 a forbidden zone for the second reticle field is defined as a region inside the second area wherein no first layout shape formed on the first design level is permitted. The forbidden zone contains a second layout shape formed on a second design level. In some embodiments, the second layout shape comprises a contact design level or a second gate design level. In some embodiments, the second layout shape comprises a via design level or second metallization design level.

At 508 the first and second areas are abutted to form an interconnect zone within the second area. The interconnect zone comprises an intersection of the extension zone and the forbidden zone. As a result, the first layout shape of the first die resides inside the second area of the second die. The second layout shape overlaps the first layout shape upon abutment, to form a connection between active circuitry the first and second reticle fields.

In some embodiments, layout guidelines in the form of design rules are defined govern allowed geometries and placement of the extension zone and first layout shape relative to the first area, and allowed geometries and placement of the forbidden zone and the second layout shape relative to the second layout area, respectively. The extension zone, forbidden zone, and the first and second layout shapes are then placed according to the layout guidelines.

Figure 6:
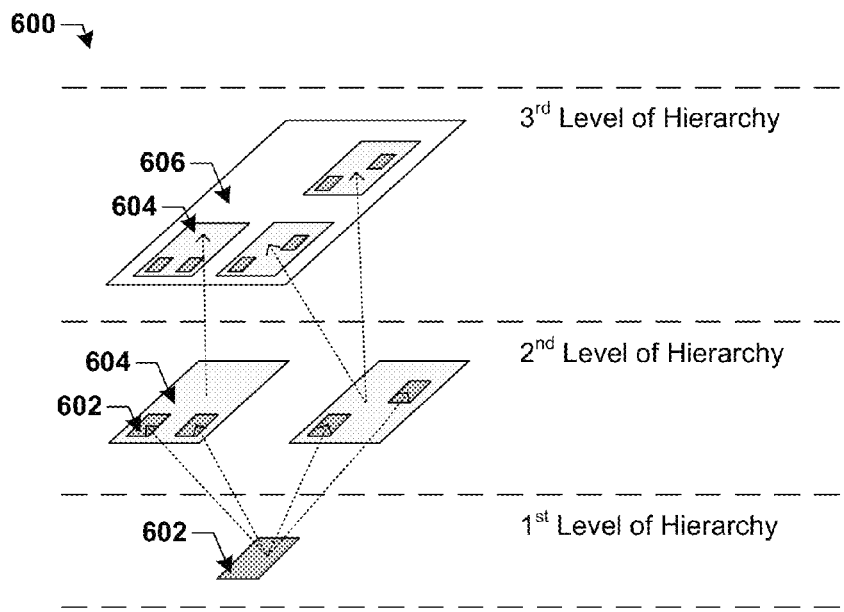
FIG. 6 illustrates an example of layout design hierarchy.

FIG. 6 illustrates an example of layout design hierarchy. It is appreciated by one or ordinary skill in the art of layout design that for large layouts a design hierarchy may be employed to reduce data size. This reduction can also reduce layout verification time (e.g., avoid checking a repeated cell against the design rules multiple times). A method of cell "instantiation" through layout design hierarchy is illustrated in the embodiments of FIG. 6, wherein a primitive cell 602 comprising a transistor-level representation of a circuit design (e.g., a single FET, or other device) is defined in a first level of design hierarchy. One or more such primitive cells 602 are instantiated in a second level of design hierarchy to form a layout macro 604 comprising a functional circuit (i.e., NAND, NOR, XOR, etc.). Some embodiments of primitive cell instantiation comprises symmetry operations such as flipping or rotation. One or more layout macros 604 are then be instantiated in a third level of design hierarchy, to form a chip layout 606. This type of hierarchical instantiation may be repeated through an arbitrary number of hierarchical levels.

Various embodiments of hierarchical layout design employ different levels of hierarchy to achieve layout efficiency. For the embodiments of the present disclosure, a connection between a first layout shape of a first chip layout and a second layout shape of a second chip layout is formed with a third layout shape, which resides in a level of layout design hierarchy which is above a top level of layout design hierarchy of the first and second chip layouts.

Figure 7:
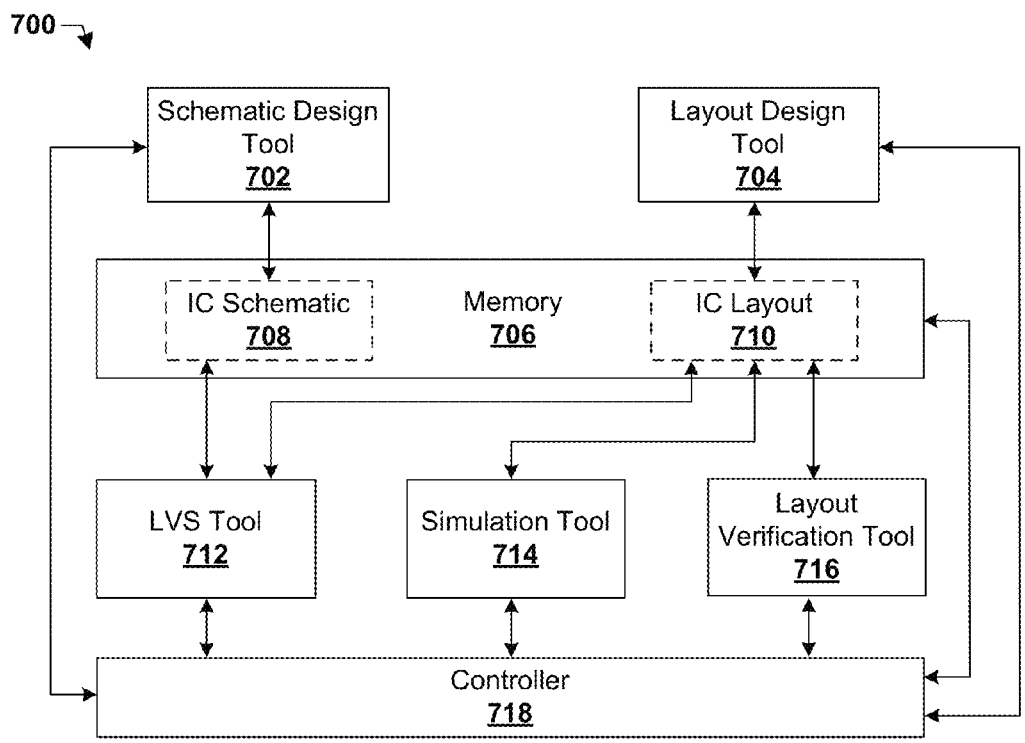
FIG. 7 illustrates some embodiments of a design system, configured to form an IC comprising a die further comprising two adjacent reticle fields on a wafer.

FIG. 7 illustrates some embodiments of a design system 700, configured to form an IC, comprising a die further comprising two adjacent reticle fields, by forming a connection across the boundary between the two adjacent reticle fields. The design system 700 comprises a comprising a schematic design tool 702 such as a CADENCE VIRTUOSO or MENTOR GRAPHICS design window, configured to produce a schematic representation 708 of a circuit.

The design system 700 further comprises a layout design tool 704, configured to produce a layout representation 710 of the circuit corresponding to the schematic representation 708, where circuit components are formed with physical shapes such as design layers (e.g., gate design level, metallization design level, etc.) for manufacturing. For the embodiments of FIG. 7, the layout design tool 704 is further configured to define a first area of a first reticle field and a second area of a second reticle field, wherein the first and second areas are each surrounded by a boundary. The layout design tool is further configured to define an extension zone for the first or second reticle field as a region outside the first or second area boundary, comprising a first layout shape formed on a first design level. The layout design tool is further configured to define a forbidden zone for the first or second reticle field as a region inside the first or second area boundary, wherein no layout shape formed on the first design level is placed. The layout design tool is further configured abut the first and second areas, such that the first layout shape of the first reticle field resides inside the second area of the second reticle field. The layout design tool is further configured to overlap the first layout shape with a second layout shape formed on a second design level within the forbidden zone of the second reticle field, forming a connection between circuitry the first and second reticle fields.

The design system 700 further comprises a memory 706, configured to store the schematic and layout representations 708, 710. An LVS tool 712 is configured to determine whether the layout representation 710 corresponds to the schematic representation 708. The LVS tool 712 contains LVS checking software such as CALIBRE, QUARTZ, or HERCULES, which recognizes drawn layout shapes on the design layers of the layout representation 710 that correspond to the electrical components of the circuit (e.g., wires, pins, etc.) of the schematic representation 708. A simulation tool 714 containing SPICE or SPECTRE software is coupled to the memory 706, and configured to model the electrical behavior of the schematic representation at 708 or the layout representation 710 within the design window.

The design system 700 further comprises a layout verification tool 716, configured to reference layout guidelines for the first and second reticle fields which define allowed geometries and placement of the extension zone, forbidden zone, and the first and second layout shapes relative to the first and second reticle field areas. The layout guidelines comprise design rules, which are encoded into a design rule checking code such a CALIBRE or QUARTZ format, and configured to verify placement of the extension zone, forbidden zone, and the first and second layout shapes according to the layout guidelines.

Figure 8A:
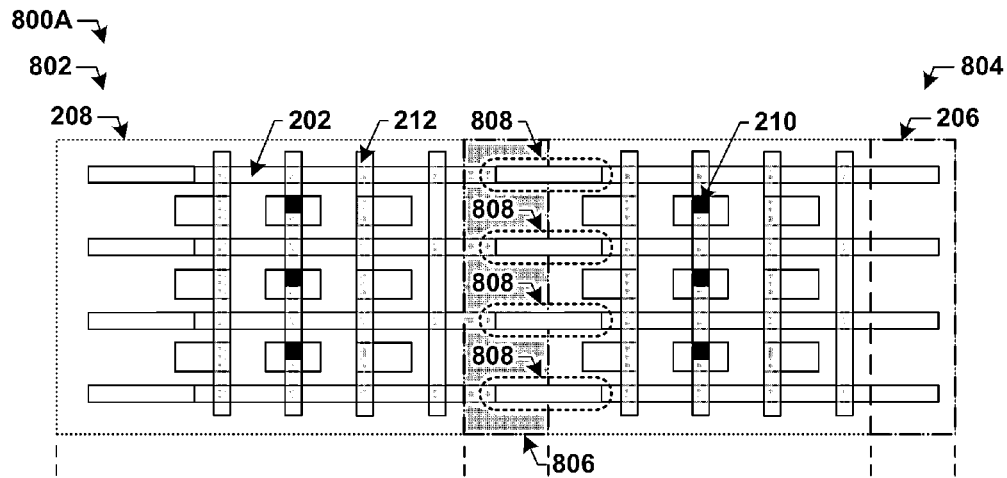
FIGS. 8A-8C illustrate some embodiments of a connection formed across a boundary between two adjacent reticle fields.
Figure 8B:
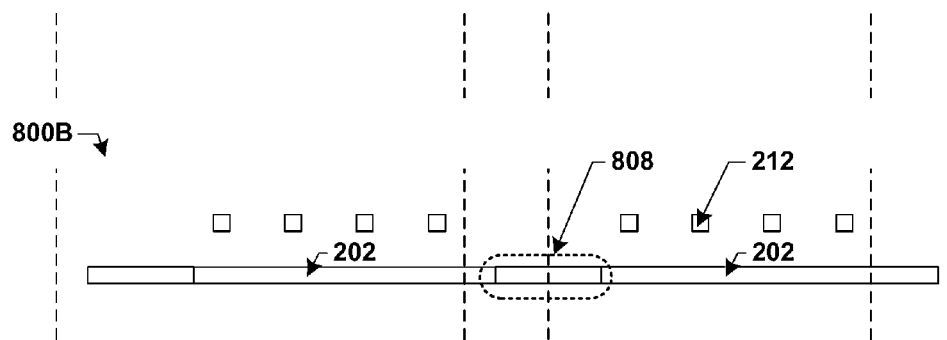
Figure 8C:
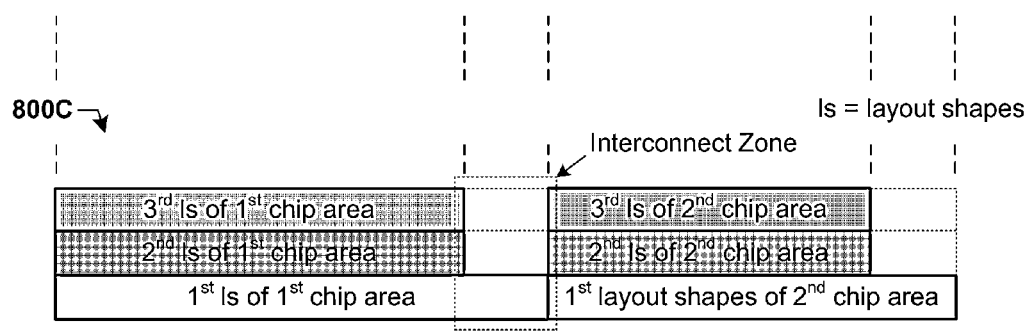

FIGS. 8A-8C illustrate some embodiments of a connection formed across a boundary between two adjacent reticle fields. The embodiments of FIGS. 8A-8C are substantially identical to the embodiments of FIGS. 3A-3C, with the exception that the embodiments of FIGS. 8A-8C utilize an extension of the first layout shapes to form connections 808 in place of the second and third layout shapes 210, 212, to reduce mask misalignment effects of the step-and-repeat tool. The mask misalignment effects can result in offsets between the first, second, and third layout shapes 202, 210, 212, which can reduce contact area and degrade electrical performance of an IC formed by the connected reticle fields.

FIG. 8A illustrates the top view 800A of an abutment of a first chip area 802 and a second chip area 804 each comprising layout view 200B, to form an interconnect zone 806 within the second chip area 804. The interconnect zone 806 comprises an intersection of the extension zone 206 and the forbidden zone 208 of the layout views 200B. Connections 808 are formed between the first and second chip areas 802, 804 through the first layout shapes 202 of the first chip area.

FIG. 8B illustrates a cross-sectional view 800B of the top view 800A, comprising a connection 808 between the first and second chip areas 802, 804 within the interconnect zone 806. FIG. 8C illustrate cross-sectional view 800C of layout shape occupancy within the first and second chip areas 802, 804, and the interconnect zone 806. Note that when a single layer (e.g., first layout shapes 202) is used to form the connections 808, and the remaining layout shapes on the other design layers may be constrained to their respective reticle boundaries. It is appreciated that various embodiments may employ a different layer constraints within the reticle field boundaries, extension zones 206, and the forbidden zones 208, to achieve a comparable result.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, it will be appreciated that the present disclosure relates to a method and system to achieve an IC dimension which is greater than a size of an exposure field of an illumination tool. The method comprises defining a first area of a first reticle field, and a second area of a second reticle field. An extension zone is created as a region outside the first area, and includes a first layout shape formed on a first design level. A corresponding forbidden zone is then created for the second reticle field as a region inside the second area where no layout shape formed on the first design level is permitted. A second layout shape is then formed on a second design level within the forbidden zone. The first and second areas are then abutted when forming a plurality of reticle fields for wafer patterning. Upon abutment of the first and second areas, the second layout shape overlaps the first layout shape to form a connection between circuitry of the first and second reticle fields.

In some embodiments, a method of forming a connection across a reticle field boundary is disclosed. The method comprises defining a first area of a first reticle field and a second area of a second reticle field, and defining an extension zone as a region outside the first area comprising a first layout shape formed on a first design level. The method further comprises abutting the first and second areas, such that the first layout shape of the first reticle field resides inside the second area of the second reticle field.

In some embodiments, a semiconductor device is disclosed. The semiconductor device comprises a first die comprising a first circuit component, and a second die comprising a second circuit component. The first and second circuit components are coupled by a connection across a scribe line which separates the first and second die.

In some embodiments, a design system for an integrated circuit is disclosed. The design system comprises a layout design tool configured to define an area of a first reticle field and a second area of a second reticle field, wherein the first and second areas are surrounded by a boundary. The design system is further configured to define an extension zone for the first or second reticle field as a region outside the first or second area comprising a first layout shape formed on a first design level, and to define a forbidden zone for the first or second reticle field as a region inside the first or second area wherein no layout shape formed on the first design level is placed. The design system is further configured to abut the first and second areas, such that the first layout shape of the first reticle field resides inside the second area of the second reticle field.

What is claimed is:

1. A semiconductor device, comprising:
a die comprising a combined reticle field with an oblong shape that extends in a first direction for a larger distance than in a second direction, wherein the combined reticle field has a first reticle field comprising a first plurality of layout shapes on a first design level and a second reticle field comprising a second plurality of layout shapes on the first design level;
wherein the first plurality of layout shapes extend into the second reticle field to positions spatially separated from the second plurality of layout shapes along a boundary region that extends across the combined reticle field in the second direction, wherein the boundary region is devoid of layout shapes on the first design level;
wherein one or more of the first plurality of layout shapes are electrically coupled to one or more of the second plurality of layout shapes by a connection disposed on second design layer, which extends across the boundary region.

2. The semiconductor device of claim 1, wherein the connection across boundary comprises a first feature which originates in the first reticle field, extends across the boundary, and connects to a second feature in the second reticle field.

3. The semiconductor device of claim 2, wherein the first feature comprises a first gate structure, and the second feature comprises a gate contact or a second gate structure.

4. The semiconductor device of claim 2, wherein the first feature comprises a first metallization structure and the second feature comprises a via structure or second metallization structure.

5. The semiconductor device of claim 1, wherein the first reticle field and the second reticle field comprise identical circuit structures.

6. A method of patterning a wafer, comprising:
forming a first reticle field having a first plurality of layout shapes corresponding to a first design level relating to a first plurality of structures to be formed on a semiconductor substrate, wherein the first reticle field comprises a first forbidden zone devoid of layout shapes;
forming a second reticle field having a second plurality of layout shapes corresponding to the first design level;
positioning the first reticle field and the second reticle field so that the first forbidden zone of the first reticle field overlaps a part of the second plurality of layout shapes within the second reticle field; and
interconnecting the first plurality of layout shapes to the second plurality of layout shapes using a second design level.

7. The method of claim 6, further comprising:
forming a third reticle field comprising a third plurality of layout shapes on the second design level; and
positioning the third reticle field so that the third plurality of layout shapes abut the first plurality of layout shapes and the second plurality of layout shapes within the first forbidden zone.

8. The method of claim 7, further comprising:
forming a fourth reticle field comprising one or more layout shapes on a third design level; and
positioning the fourth reticle field so that the one or more layout shapes couple the third plurality of layout shapes abutting the first plurality of layout shapes to the third plurality of layout shapes abutting the second plurality of layout shapes within the first forbidden zone.

9. The method of claim 8, wherein the third design level resides above the first design level and the second design level in a layout design hierarchy.

10. The method of claim 8, wherein edges of the third reticle field are vertically aligned with edges of the second reticle field and are offset from edges of the first reticle field.

11. The method of claim 10, wherein edges of the fourth reticle field are vertically aligned with edges of the third reticle field.

12. The method of claim 6, wherein the first design level comprises a first gate design level, and the second design level comprises a contact design level.

13. The method of claim 6, wherein the first design level comprises a first metallization design level and the second design level comprises a via design level.

14. The method of claim 6, wherein the first reticle field and the second reticle field comprise identical circuit layouts.

15. The method of claim 6, wherein the second reticle field comprises a second forbidden zone disposed along a first edge of the second reticle field, which opposes a second edge of the second reticle field that overlaps the first reticle field.

16. The method of claim 6, wherein the first plurality of layout shapes are spatially separated from the second plurality of layout shapes on the first design level.

17. A method of patterning a wafer, comprising:
forming a first reticle field using a layout design system including a schematic design tool, wherein the first reticle field comprises a first interconnect zone having a first plurality of layout shapes corresponding to a first design level and a first forbidden zone devoid of layout shapes corresponding to the first design level;
forming a second reticle field using the layout design system, wherein the second reticle field comprises a second interconnect zone having a second plurality of layout shapes corresponding to the first design level and a second forbidden zone devoid of layout shapes corresponding to the first design level;
positioning the first reticle field to partially overlap the second reticle field so that the second plurality of shapes extend into the first forbidden zone in a layout representation that is stored in a memory;
positioning a third reticle field over the second reticle field, wherein the third reticle field comprises a third plurality of layout shapes corresponding to a second design level, which contact the first plurality of shapes and the second plurality of layout shapes within the first forbidden zone; and
positioning a fourth reticle field over the third reticle field, wherein the fourth reticle field comprises one or more layout shapes corresponding to a third design level, which couple the third plurality of layout shapes that contact the first plurality of shapes to the third plurality of layout shapes that contact the second plurality of layout shapes within the first forbidden zone.

18. The method of claim 17, wherein the second forbidden zone is disposed along a first edge of the second reticle field, which opposes a second edge of the second reticle field that overlaps the first reticle field.

19. The method of claim 17, wherein the third design level resides above the first design level and the second design level in a layout design hierarchy.

20. The method of claim 17, wherein the first plurality of layout shapes are spatially separated from the second plurality of layout shapes on the first design level.

* * * * *